(12) United States Patent
Huang et al.

(10) Patent No.: US 11,764,081 B2
(45) Date of Patent: Sep. 19, 2023

(54) WAFER CLEANING APPARATUS AND METHOD

(71) Applicant: Taiwan Semiconductor Manufacturing Co., Ltd., Hsinchu (TW)

(72) Inventors: Jieh-Chau Huang, Hsinchu (TW); Bi-Ming Yen, Hsinchu (TW); Hung-Lung Hu, Tainan (TW); Ying Ting Hsia, Kaohsiung (TW); Ping-Jung Huang, Douliou (TW); Pei Yen Hsia, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/350,036

(22) Filed: Jun. 17, 2021

(65) Prior Publication Data
US 2021/0313200 A1 Oct. 7, 2021

Related U.S. Application Data

(62) Division of application No. 16/100,635, filed on Aug. 10, 2018, now Pat. No. 11,056,358.
(Continued)

(51) Int. Cl.
*H01L 21/67* (2006.01)
*H01L 21/673* (2006.01)
*H01L 21/687* (2006.01)

(52) U.S. Cl.
CPC .... *H01L 21/67051* (2013.01); *H01L 21/6719* (2013.01); *H01L 21/67248* (2013.01);
(Continued)

(58) Field of Classification Search
CPC .......... H01L 21/67051; H01L 21/6719; H01L 21/67248; H01L 21/67253;
(Continued)

(56) References Cited

U.S. PATENT DOCUMENTS

| 5,190,064 A | 3/1993 | Aigo |
| 5,427,608 A | 6/1995 | Auer et al. |

(Continued)

FOREIGN PATENT DOCUMENTS

| CN | 102044412 A | 5/2011 |
| CN | 106158704 A | 11/2016 |

(Continued)

OTHER PUBLICATIONS

Office Action, dated Apr. 16, 2021, for Chinese Intellectual Property Office Appl. No. 201811308933.1, 9 pages.

*Primary Examiner* — Sharidan Carrillo
(74) *Attorney, Agent, or Firm* — Sterne, Kessler, Goldstein & Fox P.L.L.C.

(57) ABSTRACT

The present disclosure relates to an apparatus for wafer cleaning. The apparatus includes an enclosure made of a noncombustible material, a wafer holder, a cleaning nozzle, at least one sensor, and an exhaust unit. The wafer holder can hold and heat a wafer. The cleaning nozzle can supply a flow of a cleaning fluid onto a surface of the wafer. The at least one sensor can detect attributes of the wafer. The exhaust unit can expel a vapor generated by the cleaning fluid in the enclosure. The exhaust unit can include a rinse nozzle to rinse the vapor passing through the exhaust unit with a mist.

20 Claims, 8 Drawing Sheets

Related U.S. Application Data (60) Provisional application No. 62/585,711, filed on Nov. 14, 2017.

(52) U.S. Cl.
CPC .. *H01L 21/67253* (2013.01); *H01L 21/67288* (2013.01); *H01L 21/67393* (2013.01); *H01L 21/6875* (2013.01); *H01L 21/68728* (2013.01)

(58) Field of Classification Search
CPC ......... H01L 21/67288; H01L 21/67393; H01L 21/68728; H01L 21/6875
See application file for complete search history.

(56) References Cited

U.S. PATENT DOCUMENTS

| | | | |
|---|---|---|---|
| 5,944,894 | A | 8/1999 | Kitano et al. |
| 6,280,696 | B1 | 8/2001 | Hsu et al. |
| 6,401,361 | B1 | 6/2002 | Chen et al. |
| 8,475,668 | B2 | 7/2013 | Tanaka et al. |
| 10,553,421 | B2 | 2/2020 | Ishida et al. |
| 2002/0096495 | A1 | 7/2002 | Nguyen et al. |
| 2003/0045131 | A1 | 3/2003 | Verhaverbeke et al. |
| 2003/0141016 | A1 | 7/2003 | Okase et al. |
| 2003/0178047 | A1 | 9/2003 | Hirae |
| 2004/0040499 | A1 | 3/2004 | Huang et al. |
| 2004/0159343 | A1 | 8/2004 | Shimbara et al. |
| 2005/0193587 | A1* | 9/2005 | Tsai ............... H01L 21/67034 34/467 |
| 2005/0252903 | A1 | 11/2005 | Maki et al. |
| 2006/0183812 | A1 | 8/2006 | Miller et al. |
| 2007/0181163 | A1 | 8/2007 | Wada et al. |
| 2008/0044651 | A1 | 2/2008 | Douglas |
| 2008/0173327 | A1 | 7/2008 | Miyagi |
| 2008/0251107 | A1 | 10/2008 | Osada et al. |
| 2009/0032062 | A1 | 2/2009 | Randhawa et al. |
| 2009/0324842 | A1 | 12/2009 | Tanaka et al. |
| 2009/0325469 | A1 | 12/2009 | Koo et al. |
| 2010/0059478 | A1 | 3/2010 | Lee et al. |
| 2011/0089137 | A1 | 4/2011 | Tanaka et al. |
| 2012/0055403 | A1 | 3/2012 | Gomi et al. |
| 2012/0080061 | A1 | 4/2012 | Kim et al. |
| 2012/0304485 | A1 | 12/2012 | Hayashi et al. |
| 2012/0312332 | A1 | 12/2012 | Minami et al. |
| 2014/0116478 | A1 | 5/2014 | Higashijima et al. |
| 2014/0130825 | A1* | 5/2014 | Brown ............... H01L 21/31138 134/1.3 |
| 2014/0224334 | A1 | 8/2014 | Pan et al. |
| 2014/0238443 | A1 | 8/2014 | Lee et al. |
| 2015/0079735 | A1 | 3/2015 | Chang et al. |
| 2015/0107623 | A1 | 4/2015 | Chien et al. |
| 2015/0364388 | A1 | 12/2015 | Waldmann et al. |
| 2016/0064242 | A1 | 3/2016 | Obweger et al. |
| 2016/0196984 | A1 | 7/2016 | Lill et al. |
| 2017/0108149 | A1 | 4/2017 | Imai et al. |
| 2017/0282210 | A1 | 10/2017 | Okutani et al. |
| 2018/0012778 | A1 | 1/2018 | Nakai |
| 2019/0148181 | A1 | 5/2019 | Huang et al. |

FOREIGN PATENT DOCUMENTS

| | | | |
|---|---|---|---|
| CN | 107112231 A | 8/2017 | |
| EP | 2854163 A1 * | 4/2015 | ............... B08B 3/10 |
| JP | H09148294 A | 6/1997 | |
| JP | H1174168 A | 3/1999 | |
| JP | 2000315673 A | 11/2000 | |
| JP | 2006286947 A | 10/2006 | |
| JP | 2007317821 A | 12/2007 | |
| JP | 2016189389 A | 11/2016 | |

* cited by examiner

WAFER CLEANING APPARATUS AND METHOD

CROSS-REFERENCE TO RELATED APPLICATION

This application is a divisional application of U.S. patent application Ser. No. 16/100,635, filed on Aug. 10, 2018, titled "Wafer Cleaning Apparatus and Method," which claims the benefit of U.S. Provisional Patent Application No. 62/585,711, filed on Nov. 14, 2017, titled "Wafer Cleaning Apparatus and Method." The entire contents of both applications are incorporated herein by reference.

BACKGROUND

The cleaning process used with semiconductor wafers (e.g., silicon wafers) is an important step in the manufacturing process of semiconductor devices and microelectromechanical systems (MEMS). The yield of a silicon wafer is inversely related to the defect density (e.g., cleanliness and particle count) from wafer processing. An objective of the wafer cleaning process is to remove chemical and particle impurities without altering or damaging a wafer's surface or substrate.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate The term "substantially" as used herein indicates the value of a given quantity varies by, for example, ±1% to ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Various embodiments in accordance with the present disclosure provide an apparatus and a method for wafer cleaning in semiconductor device manufacturing with high safety to avoid flash burning and explosion. Wafer cleaning processes include, for example, Radio Corporation of America (RCA) cleaning, film removal cleaning, post-etch clean, pre-diffusion clean, metallic ion removal clean, particle removal clean, etc. Some of the wafer cleaning processes involve heating of cleaning chemicals, which are known as "high temperature wet clean processes." Because high solvent vapor concentration, e.g., isopropyl alcohol (IPA) gas, at a high temperature can be flash ignited by static electricity, the high temperature wet clean processes can have safety risks. Thus, risk of burning, igniting, and explosion becomes a serious safety issue in wafer cleaning apparatuses and methods.

In some embodiments of the present disclosure, noncombustible materials can be used for building the enclosure of the wafer cleaning apparatus to reduce the risk of fire. Static electric charge can be substantially reduced by improving the grounding of the wafer cleaning apparatus to avoid the risk of flash burning (e.g., of cleaning chemicals). In some embodiments of the present disclosure, various sensors can be implemented in the wafer cleaning apparatus to monitor the wafer surface temperature and process, for example, in real time. The current operation cycle or the operation of the apparatus can be stopped in response to detection of abnormal conditions (e.g., high temperature or abnormal thermal-distribution at the surface of the wafer) by the sensors during wafer cleaning.

In some embodiments of the present disclosure, a six-pin wafer holder design can minimize or eliminate a wafer slide issue during wafer cleaning. During wafer cleaning, some of the pins of the wafer holder (e.g., clamp pins) may be released due to various reasons (e.g., malfunction), thereby causing the wafer to slide off the wafer holder and be contaminated or damaged. The six-pin wafer holder can include support pin(s) to secure the wafer.

In some embodiments of the present disclosure, inert gas flow can be used to replace air flow to reduce the oxygen concentration in the wafer cleaning apparatus. The mixture of oxygen and other flammable gases (e.g., hydrogen gas, IPA vapor, etc.) can be ignited when the oxygen concentration is above a certain level. By reducing the oxygen concentration in the wafer cleaning apparatus, the risk of explosion can be reduced.

Figure 1:
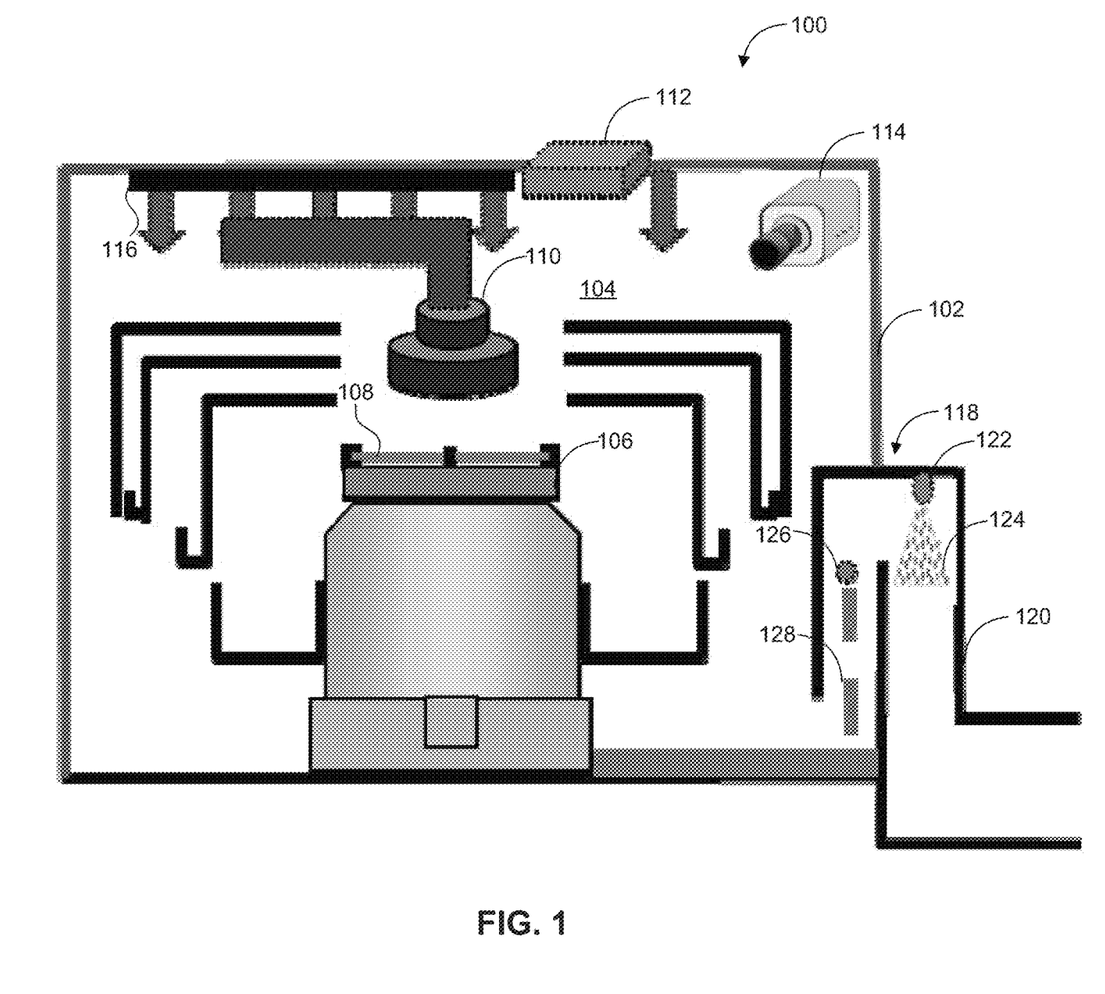
FIG. 1 is a diagram of an exemplary wafer cleaning apparatus, in accordance with some embodiments.

FIG. 1 is a diagram of an exemplary wafer cleaning apparatus 100, in accordance with some embodiments. Wafer cleaning apparatus 100 can include an enclosure 102 forming an inner space 104 (or a chamber) of wafer cleaning apparatus 100 in which the wafer cleaning is conducted. In some embodiments of the present disclosure, enclosure 102 may include vertical walls, a ceiling, and a floor. In some embodiments of the present disclosure, one or more openings can be made in one or more of the vertical walls, ceiling, and floor to install units that can make a gas exchange, e.g., sucking air or expelling exhaust. The material used to form enclosure 102 may be a noncombustible material to avoid flammability, such as but not limited to, Ethylene ChloroTriFluoroEthylene (ECTFE), Polyvinylidene fluoride (PVDF), or Perfluoroalkoxy alkane (PFA).

Wafer cleaning apparatus 100 can also include a wafer holder 106 inside enclosure 102 (i.e., within inner space 104) and configured to hold a wafer 108. In some embodiments of the present disclosure, wafer holder 106 can include a heating plate such that wafer holder 106 is configured to heat wafer 108 as well as the cleaning chemicals applied on the surface of heated wafer 108 during wafer cleaning to facilitate the cleaning process. As described below in detail, in some embodiments of the present disclosure, wafer holder 106 can be designed to prevent wafer 108 from sliding during wafer cleaning. In some embodiments of the present disclosure, an inner flow system (not shown) may be operatively coupled to wafer holder 106 and configured to introduce gas flow to wafer 108 during wafer cleaning to facilitate the removal of the cleaning chemicals.

Wafer cleaning apparatus 100 can also include a cleaning nozzle 110 inside enclosure 102 (i.e., within inner space 104) and configured to supply a flow of a cleaning fluid onto a major surface of wafer 108 on wafer holder 106. Wafer 108 can include a major surface on which semiconductor device(s) can be formed. When wafer 108 is held onto wafer holder 106, the major surface is faced up toward the ceiling of enclosure 102 of wafer cleaning apparatus 100. Cleaning nozzle 110 can be controlled to dispense a preset amount of cleaning fluid from a reservoir (not shown) onto the major surface of wafer 108. In some embodiments of the present disclosure, the cleaning fluid may be IPA. It is to be appreciated that any other suitable cleaning fluids, such as but not limited to, deionized (DI) water, hydrogen peroxide, ammonium hydroxide, acids, acetone, methanol, or any combinations thereof, may be supplied by cleaning nozzle 110 onto the major surface of wafer 108. Depending on the specific cleaning fluid(s) used for wafer cleaning, the heating plate of wafer holder 106 can heat wafer 108 to a suitable temperature. For example, for IPA, wafer 108 can be heated to from about 190° C. to about 195° C. for about 30 seconds to boil the IPA.

In some embodiments of the present disclosure, at least a part of an outer surface of cleaning nozzle 110 is covered with a conducting material to reduce the risk of static electric charging. In some embodiments of the present disclosure, the structure of cleaning nozzle 110 can be made of polychlorotrifluoroethylene (PCTFE) and/or polytetrafluoroethylene (PTFE), which have static electricity values (e.g., −4.58 kV for PCTFE) that can increase the risk of static electric charging during the operation of cleaning nozzle 110. By coating at least part of the outer surface of cleaning nozzle 110 with a conducting material, such as a material with static electricity higher than about −4 kV (such as higher than −4 kV, −3.5 kV, −3 kV, −2.5 kV, −2 kV, −1.5 kV, or −1 kV), the risk of static electric charging can be reduced. In some embodiments of the present disclosure, the conducting material can be carbon nanotubes with an example carbon doping of about between 0.025 weigh (wt) % and about 0.1 wt % (such as between 0.025 wt % and 0.1 wt %, between 0.03 wt % and 0.09 wt %, between 0.04 wt % and 0.08 wt %, or between 0.05 wt % and 0.07 wt %). For example, the static electricity of carbon nanotubes coating material can be −0.8 kV, which is substantially higher than the static electricity of PCTFE. In some embodiments of the present disclosure, the conducting material can be other types of carbon-doped materials. As described below, in some embodiments of the present disclosure, an additional grounding unit (not shown) can be operatively coupled to cleaning nozzle 110 to further reduce the risk of static electric charging.

In some embodiments of the present disclosure, wafer cleaning apparatus 100 can further include a set of sensors 112 and 114 inside enclosure 102 (e.g., within inner space 104) and configured to detect a set of attributes associated with wafer 108, for example, in real time. Sensor 112 can be an infrared (IR) sensor or any other suitable sensor that can detect temperature at the major surface of wafer 108 in real time. Sensor 114 can be a camera or any other suitable sensor that can generate images in various wavelength ranges at the major surface of wafer 108, for example, in real time. The outputs of sensors 112 and 114 can be manually observed and analyzed by a human operator and/or automatically fed into an analyzing system for processing (e.g., to identify abnormal conditions). It is to be appreciated that the number of sensors used for real-time monitoring of wafer cleaning condition is not limited. In some embodiments of the present disclosure, a single sensor can be applied to monitor one specific attribute or multiple attributes associated with wafer 108. It is also to be appreciated that, in some embodiments of the present disclosure, additional sensor(s) can be used to monitor attributes associated with other units in wafer cleaning apparatus 100 besides wafer 108 during wafer cleaning, such as but not limited to, the oxygen concentration in inner space 104, the humidity in inner space 104, and the level of contamination in inner space 104 to ensure safety and/or manufacturing quality.

In some embodiments of the present disclosure, wafer cleaning apparatus 100 can further include a fan filter unit (FFU) 116 configured to supply a flow of a mixture of air and an inert gas into inner space 104 of enclosure 102. FFU 116 can be any suitable air filtering equipment for supplying filter gas flow into inner space 104 and/or removing airborne particles from inner space 104. FFU 116 can be installed within the ceiling and/or the floor of enclosure 102. FFU 116 can include a pre-filter, a high efficiency particulate air (HEPA) filter, a fan, or any combination thereof. In some embodiments of the present disclosure, FFU 116 can be disposed through the ceiling of enclosure 102 so that air outside enclosure 102 may be filtered and purged into inner space 104. FFU 116 can mix air flow with an inert gas flow, such as nitrogen gas ($N_2$) flow, and supply the air and $N_2$ mixture flow into inner space 104 of enclosure 102 to reduce the oxygen ($O_2$) concentration in inner space 104 to further reduce the risk of fire or explosion. In some embodiments of the present disclosure, the $O_2$ concentration in inner space 104 can be monitored by a sensor in real time and used for adjusting the operation of FFU 116 to maintain the $O_2$ concentration level within a desired range. It is to be appreciated that the number of FFU 116 is not limited to one. In some embodiments of the present disclosure, multiple FFUs 116 can be installed within the ceiling and/or the floor of enclosure 102 to provide a desired gas distribution and/or efficiency.

In some embodiments of the present disclosure, wafer cleaning apparatus 100 may further include an exhaust unit 118 configured to expel a vapor generated from the cleaning fluid inside enclosure 102. Exhaust unit 118 can be installed through the ceiling, one of the vertical walls, or the floor of enclosure 102. In some embodiments of the present disclosure, exhaust unit 118 can include a duct 120 disposed through the vertical walls of enclosure 102 to form a passageway for the cleaning fluid vapor to exit enclosure 102 of wafer cleaning apparatus 100. Duct 120 can be coated with adsorption materials, such as activated carbon and/or zeolite, for adsorbing the cleaning fluid vapor passing through duct 120. In some embodiments of the present disclosure, exhaust unit 118 can include a rinse nozzle 122 configured to generate a mist 124 and rinse the cleaning fluid vapor passing through duct 120 with mist 124. Vapor concentration may be reduced by mist 124 from rinse nozzle 122. As described below, in some embodiments of the present disclosure, mist 124 can be formed by rinse nozzle 122 by mixing a flow of a fluid and a flow of an inert gas, which can have a greater vapor adsorbing ability than liquid rinse only.

It is to be appreciated that the number of the rinse nozzles is not limited to the example shown in FIG. 1. In some embodiments of the present disclosure, exhaust unit 118 can further include another rinse nozzle 126 configured to generate a liquid flow 128 and rinse the cleaning fluid vapor passing through duct 120 with liquid flow 128. For example, liquid flow 128 can be DI water flow. In some embodiments of the present disclosure, rinse nozzle 122 can be configured to generate a gas flow (not shown) and rinse the cleaning fluid vapor passing through duct 120 with the gas flow (e.g., air flow or $N_2$ gas flow without liquid) to dilute the cleaning fluid vapor.

In some embodiments of the present disclosure, wafer cleaning apparatus 100 can be used for post-etch wafer cleaning using heated IPA. Once wafer 108 with etched openings, e.g., vias or trenches, on the major surface is loaded and held by wafer holder 106, cleaning nozzle 110 supplies the IPA onto the major surface of wafer 108 to fill the openings. Wafer 108 can be heated by the heating plate of wafer holder 106 to about 190° C. to about 195° C. for about 30 seconds to boil the IPA. Concurrently, $N_2$ gas flow is purged to help vaporize the heated IPA from wafer 108, according to some embodiments. The IPA vapor can be expelled by exhaust unit 118 to the outside of wafer cleaning apparatus 100. By implementing the various units described above with respect to FIG. 1 and additional units and/or functions described below, the risk of fire or explosion can be reduced in a heated IPA-based, post-etch wafer cleaning.

Figure 2:
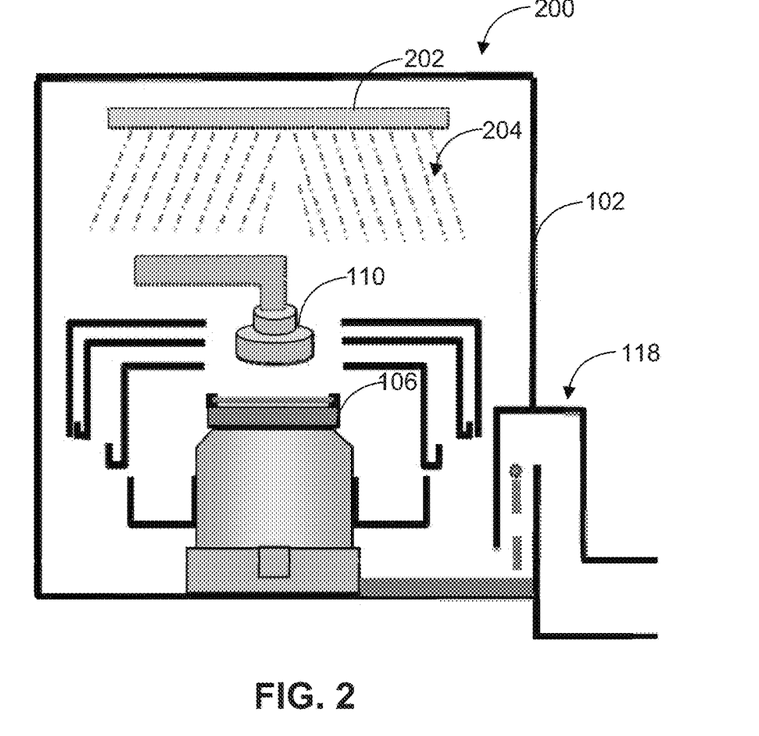
FIG. 2 is a diagram of an exemplary wafer cleaning apparatus with an ionizer, in accordance with some embodiments.

FIG. 2 is a diagram of an exemplary wafer cleaning apparatus 200 with an ionizer 202, in accordance with some embodiments. Wafer cleaning apparatus 200 includes ionizer 202 inside enclosure 102 (e.g., within inner space 104). Ionizer 202 is configured to supply corona discharges 204 to cleaning nozzle 110 to reduce the static electric charging that may occur at cleaning nozzle 110 during operation. Corona discharges 204 may be electrical discharges generated by an ionization of a fluid such as air surrounding a conductor (e.g., the conducting material coated on the outer surface of cleaning nozzle 110) that is electrically charged. For example, corona discharges 204 may have a current of 2 mA and a voltage of 2 kV.

Figure 3:
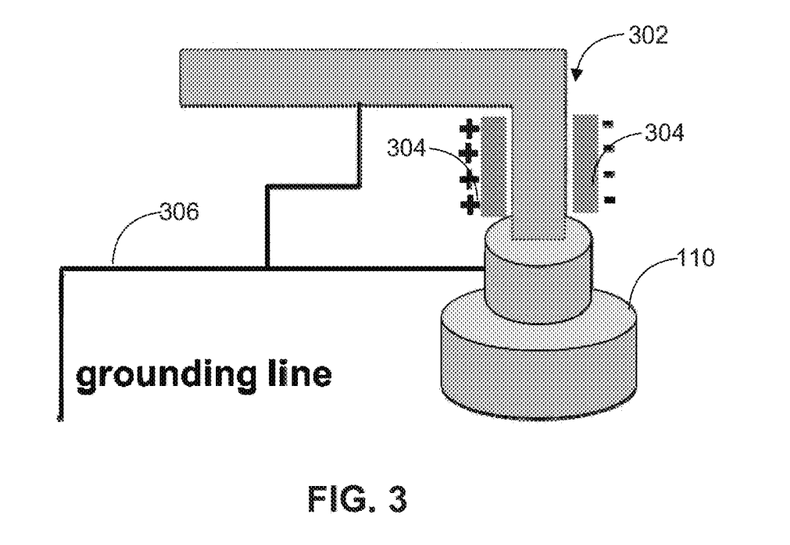
FIG. 3 is a diagram of an exemplary grounding unit for a wafer cleaning apparatus, in accordance with some embodiments.

FIG. 3 is a diagram of an exemplary grounding unit 302 for a wafer cleaning apparatus, in accordance with some embodiments. Grounding unit 302 can be used in wafer cleaning apparatus 100, 200, or any other exemplary wafer cleaning apparatus disclosed herein. Grounding unit 302 may be operatively coupled to cleaning nozzle 110 and configured to ground cleaning nozzle 110 to reduce static electric charging that can occur at cleaning nozzle 110 during operation. In some embodiments of the present disclosure, grounding unit 302 can include a magnetic grounding clamp 304 and/or a grounding line 306.

Figure 4:
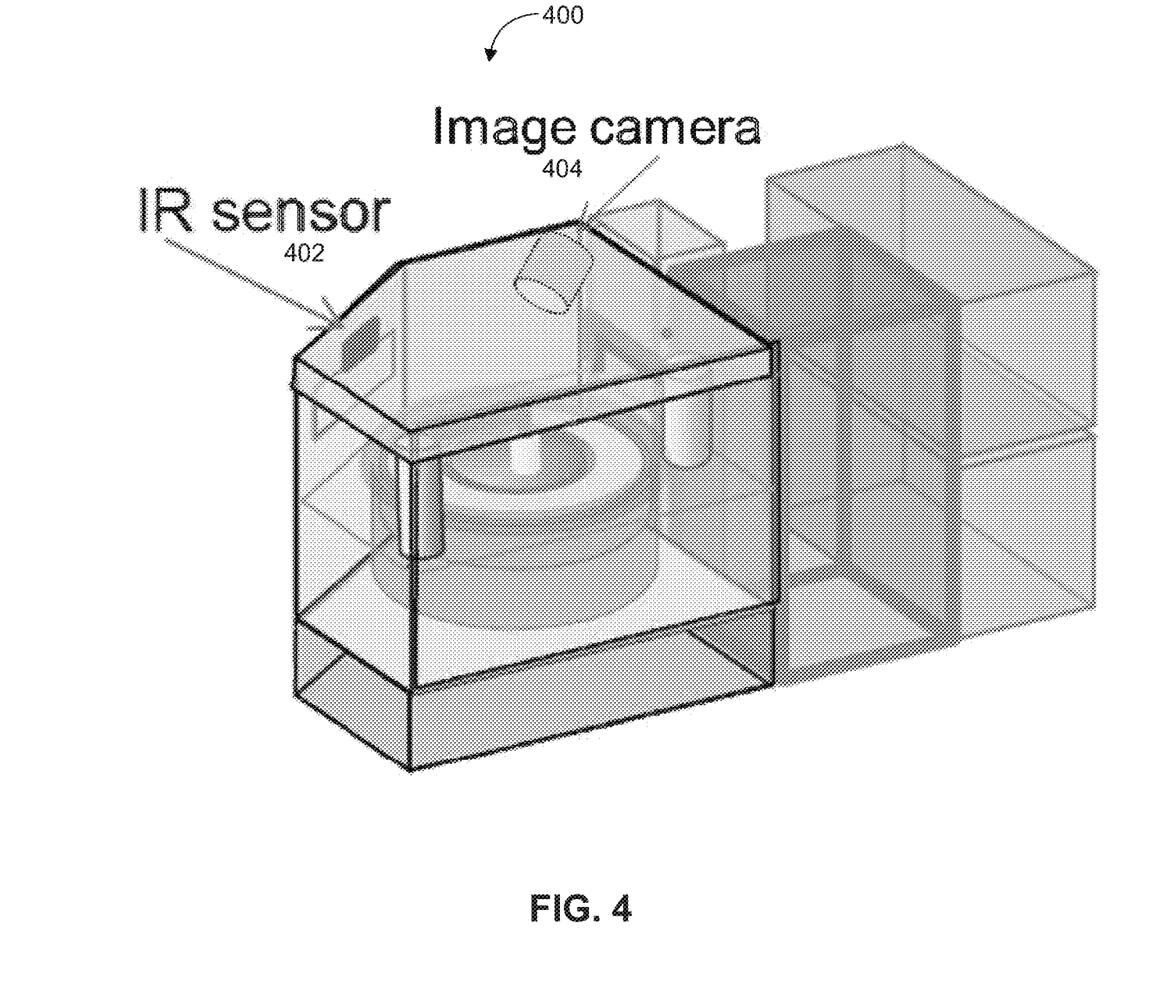
FIG. 4 is a diagram of an exemplary wafer cleaning apparatus with an infrared (IR) sensor and an image camera, in accordance with some embodiments.

FIG. 4 is a diagram of an exemplary wafer cleaning apparatus 400 with an IR sensor 402 and an image camera 404, in accordance with some embodiments. Wafer cleaning apparatus 400 can include an IR sensor 402 disposed on a vertical wall of wafer cleaning apparatus 400 and can be configured to detect a temperature at a major surface of a wafer during wafer cleaning, for example, in real time. The real time monitoring of wafer surface temperature can be synchronized to a fault detection and classification (FDC) system (not shown) operatively coupled to wafer cleaning apparatus 400. In some embodiments of the present disclosure, wafer cleaning apparatus 400 can include multiple IR sensors for real time wafer surface temperature monitoring at a common location or a different location of the major surface of the wafer. Wafer cleaning apparatus 400 can also include an image camera 404 disposed on the ceiling of wafer cleaning apparatus 400 and oriented towards the wafer during wafer cleaning. Image camera 404 can be configured to take images at the major surface of the wafer, for example, in real time. In some embodiments of the present disclosure, image pixel matching approaches can be used to analyze the images taken by image camera 404 for real-time detection of abnormal cleaning fluid film break during wafer cleaning. In some embodiments of the present disclosure, wafer cleaning apparatus 400 can further include a thermo sensor (not shown) configured to generate a thermo profile at the major surface of the wafer.

Figure 5:
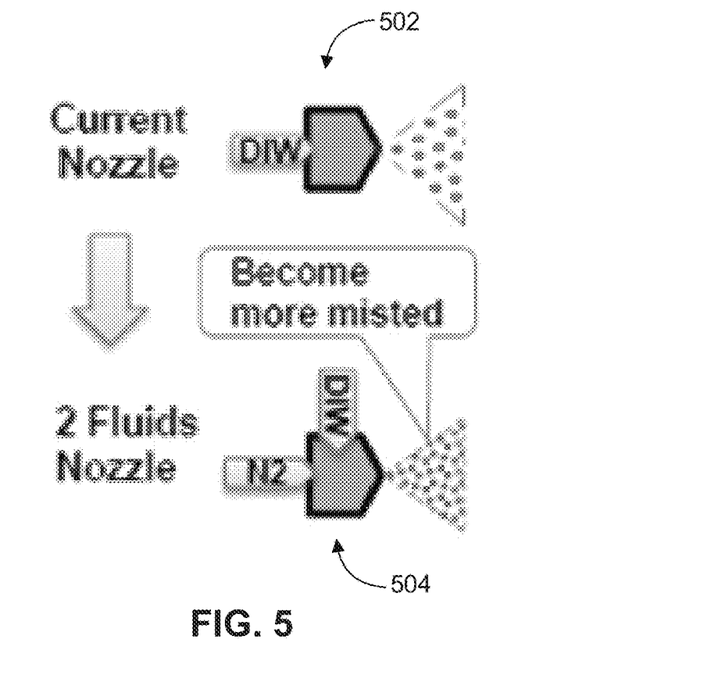
FIG. 5 is a diagram of exemplary rinse nozzles for a wafer cleaning apparatus, in accordance with some embodiments.

FIG. 5 is a diagram of exemplary rinse nozzles 502 and 504 for a wafer cleaning apparatus, in accordance with some embodiments. Rinse nozzle 502 and/or rinse nozzle 504 can be used in exhaust unit 118 of wafer cleaning apparatus 100, 200, or any other exemplary wafer cleaning apparatus disclosed herein. Rinse nozzle 502 can generate a mist of DI water or a flow of DI water. Rinse nozzle 504 can generate a mist by mixing a flow of a fluid (e.g., DI water) and a flow of an inert gas (e.g., $N_2$ gas). By introducing the inert gas flow, a mist of an output of rinse nozzle 504 can be increased as compared a mist of an output of rinse nozzle 502, thereby increasing the adsorbing ability of cleaning fluid vapor. In some embodiments of the present disclosure, the DI water at a flow rate of 0.4 L/min is mixed with the $N_2$ gas at a flow rate of 1 L/min by rinse nozzle 504. In some embodiments of the present disclosure, the $N_2$ gas flow can be replaced with air flow in forming the mist by rinse nozzle 504.

Figure 6:
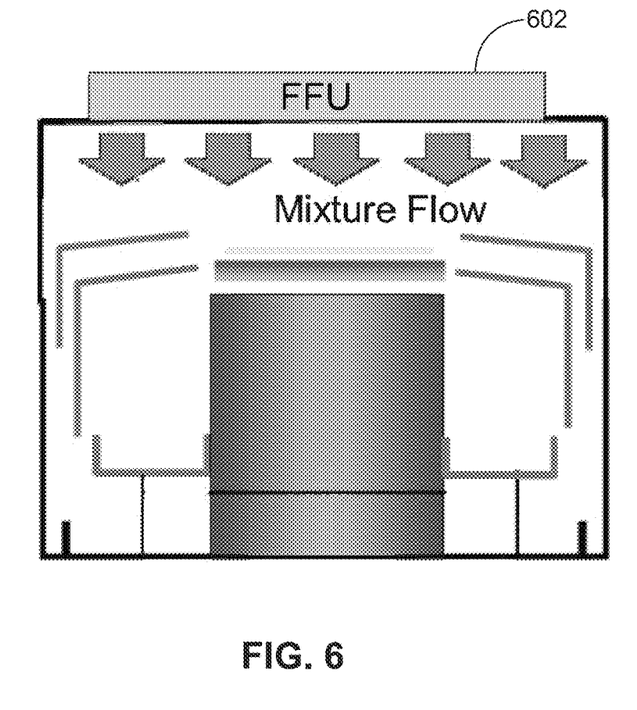
FIG. 6 is a diagram of an exemplary fan filter unit (FFU) for a wafer cleaning apparatus, in accordance with some embodiments.

FIG. 6 is a diagram of an exemplary FFU 602 for a wafer cleaning apparatus, in accordance with some embodiments. FFU 602 can be disposed at the ceiling of wafer cleaning apparatus 100, 200, 400, or any other exemplary wafer cleaning apparatus disclosed herein. FFU 602 may be configured to supply a down flow of a mixture of air and an inert gas towards the wafer during wafer cleaning to reduce an oxygen concentration. In some embodiments of the present disclosure, the inert gas may be an $N_2$ gas at a flow rate that is one-half of a flow rate of the air.

Figure 7:
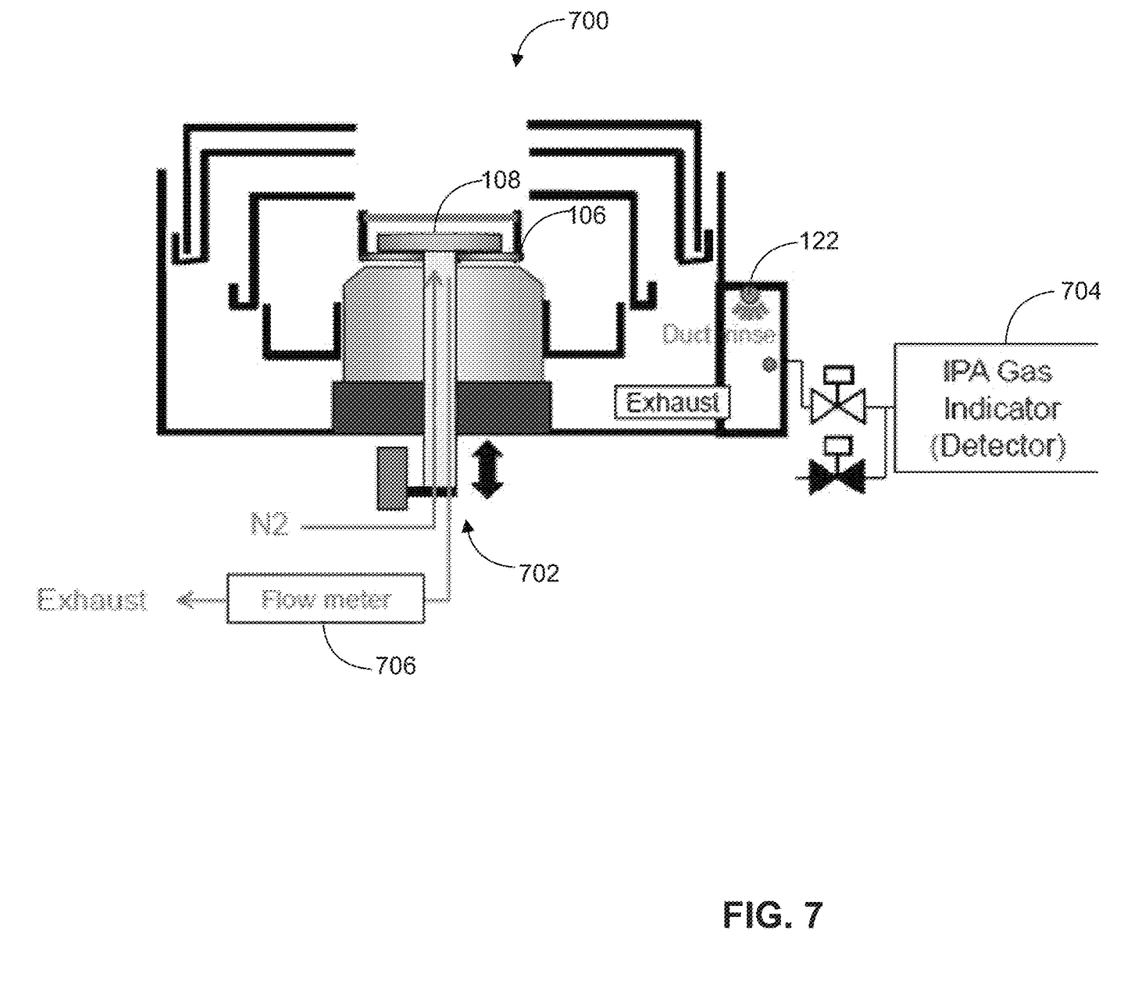
FIG. 7 is a diagram of an exemplary wafer cleaning apparatus with an inner flow unit and a gas sensor, in accordance with some embodiments.

FIG. 7 is a diagram of an exemplary wafer cleaning apparatus 700 with an inner flow unit 702 and a gas sensor 704, in accordance with some embodiments. Inner flow unit 702 and/or gas sensor 704 can be used in exhaust unit 118 of wafer cleaning apparatus 100, 200, 400, or any other exemplary wafer cleaning apparatus disclosed herein. Wafer cleaning apparatus 700 can include an inner flow unit 702 operatively coupled to wafer holder 106 and configured to supply an inert gas to another major surface of wafer 108. The inert gas may be, for example, $N_2$ gas. In some embodiments of the present disclosure, inner flow unit 702 can include a flow meter 706 configured to detect a flow rate of the inert gas flowing back from wafer 108. That is, flow meter 706 can measure the flow rate of the exhaust from wafer holder 106 to detect any abnormal conditions occurring at wafer holder 106, e.g., by the heating plate, O-ring, or coating of wafer holder 106.

Wafer cleaning apparatus 700 can also include gas sensor 704 configured to detect a concentration of the cleaning fluid vapor after being rinsed with the mist by rinse nozzle 122. For example, gas sensor 704 may be an IPA gas sensor for detecting the concentration of IPA exhaust. Wafer cleaning apparatus 700 can further include an emergency unit (not shown) configured to stop an operation of apparatus 700 based on the concentration of the cleaning fluid vapor detected by gas sensor 704. In some embodiments of the heated IPA post-etch cleaning process, two alarm levels can be set by the emergency unit: (i) the first alarm may be triggered when the IPA concentration is above 0.5%, in which the emergency unit may stop the current wafer cleaning cycle; and (ii) the second alarm can be triggered when the IPA concentration is above 1.5%, in which the emergency unit can stop wafer cleaning apparatus 700 instantly.

Figure 8:
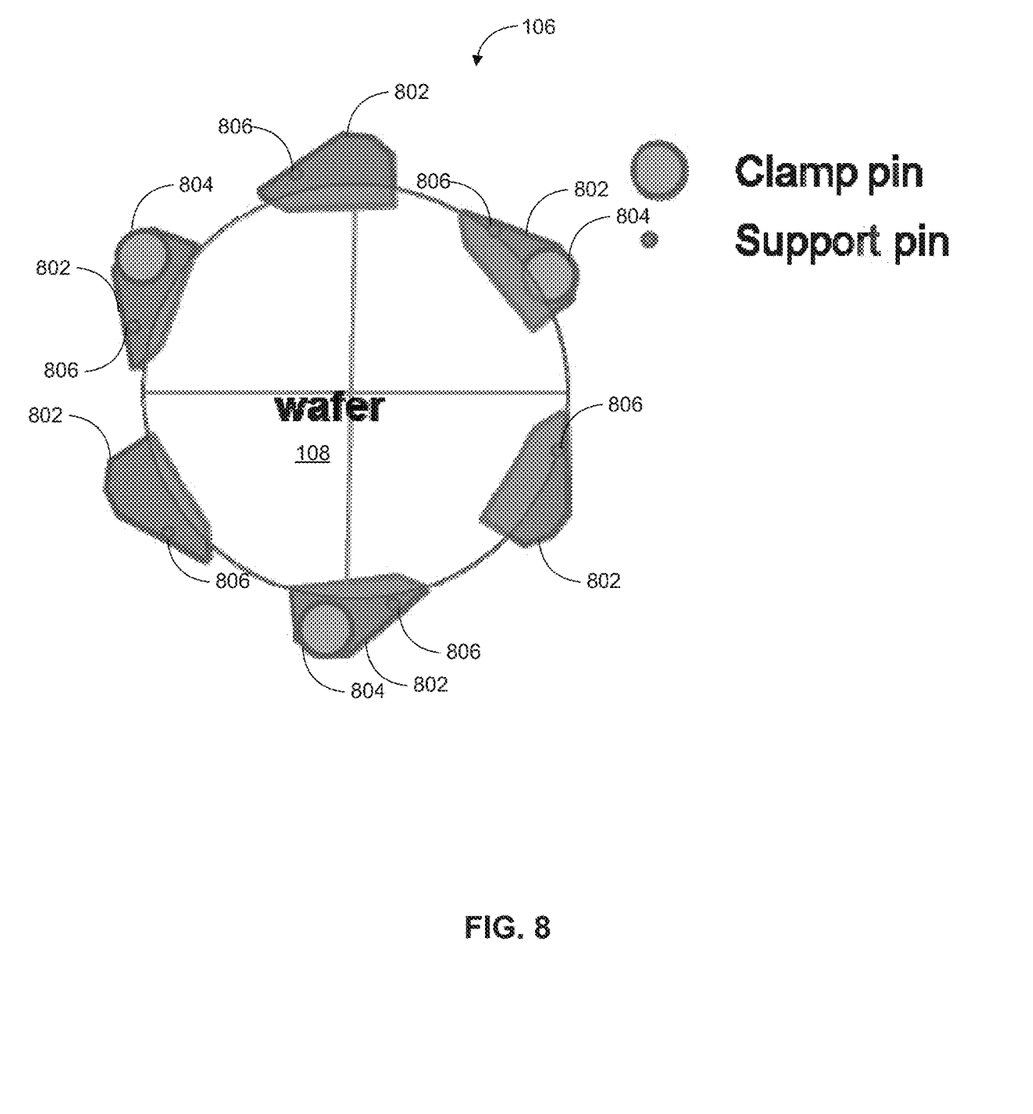
FIG. 8 is a diagram of an exemplary wafer holder for a wafer cleaning apparatus, in accordance with some embodiments.
Figure 9A:
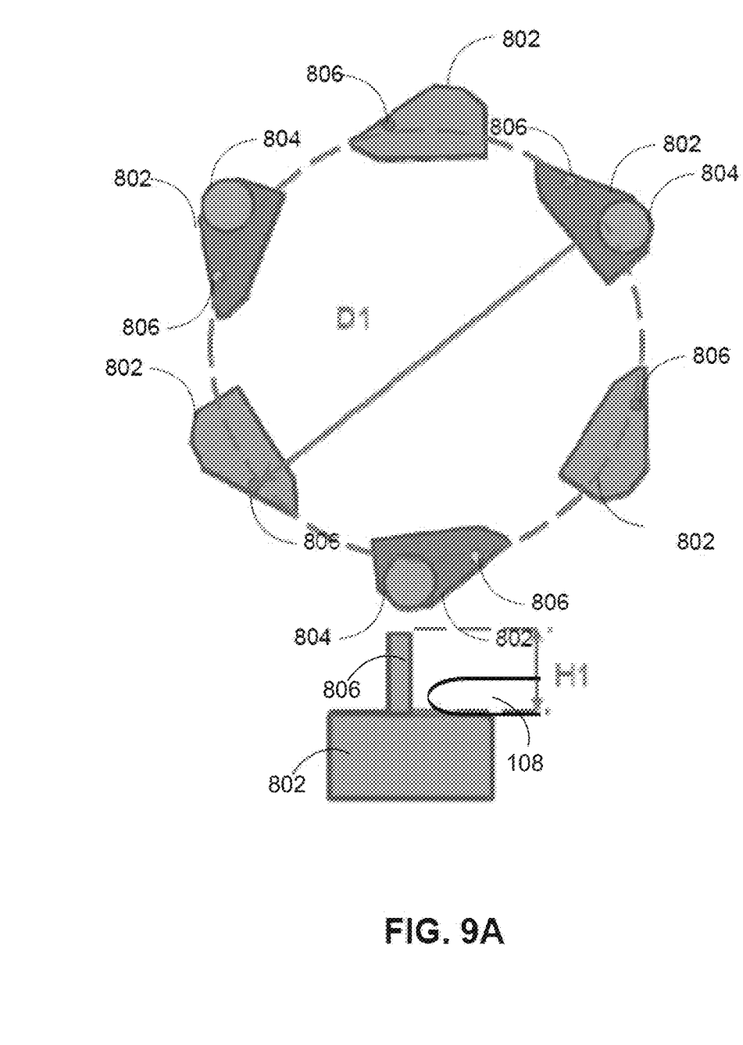
FIGS. 9A and 9B are diagrams of exemplary clamp pins and support pins for a wafer holder, in accordance with some embodiments.
Figure 9B:
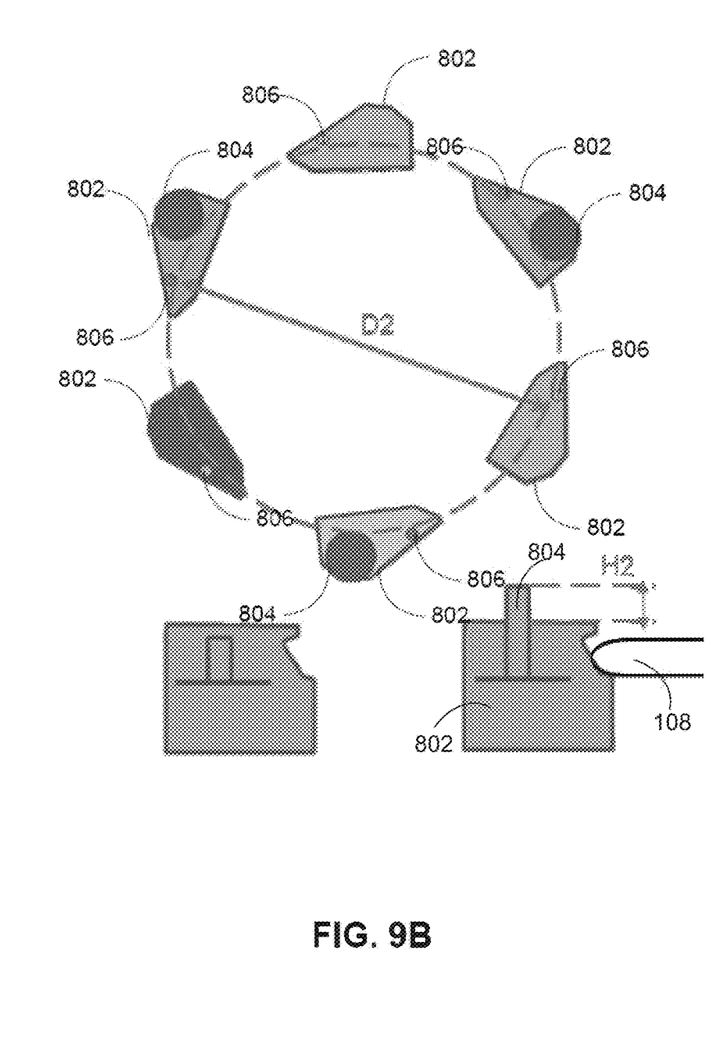

FIG. 8 is a diagram of an exemplary wafer holder 106 for a wafer cleaning apparatus, in accordance with some embodiments. Wafer holder 106 can be used in wafer cleaning apparatus 100, 200, 400, 700, or any other exemplary wafer cleaning apparatus disclosed herein. In some embodiments of the present disclosure, wafer holder 106 has a six-pin design with three additional support pins to reduce the possibility of a wafer slide during wafer cleaning. As shown in FIG. 8, wafer holder 106 can include six jaws 802. Three jaws 802 each includes a clamp pin 804 and a support pin 806, and the other three jaws 802 each includes a support pin 806 but no clamp pin 804. That is, in some embodiments of the present disclosure, wafer holder 106 may include six support pins 806 and three clamp pins 804. The two types of jaws can be alternatively and evenly arranged along the circumference of wafer 108. As shown in FIGS. 9A and 9B, D1 is a diameter of the circle formed by support pins 806, H1 is a height of support pins 806 above jaws 802, D2 is a diameter of a circle formed by clamp pins 804, and H2 is a height of clamp pins 804 above jaws 802. In some embodiments of the present disclosure, D1 is larger than D2. For example, D1 may be 300.8 mm, and D2 may be 300.5 mm. In some embodiments of the present disclosure, H1 is larger than H2. For example, H1 may be 2 mm, and H2 may be 1 mm.

Figure 10:
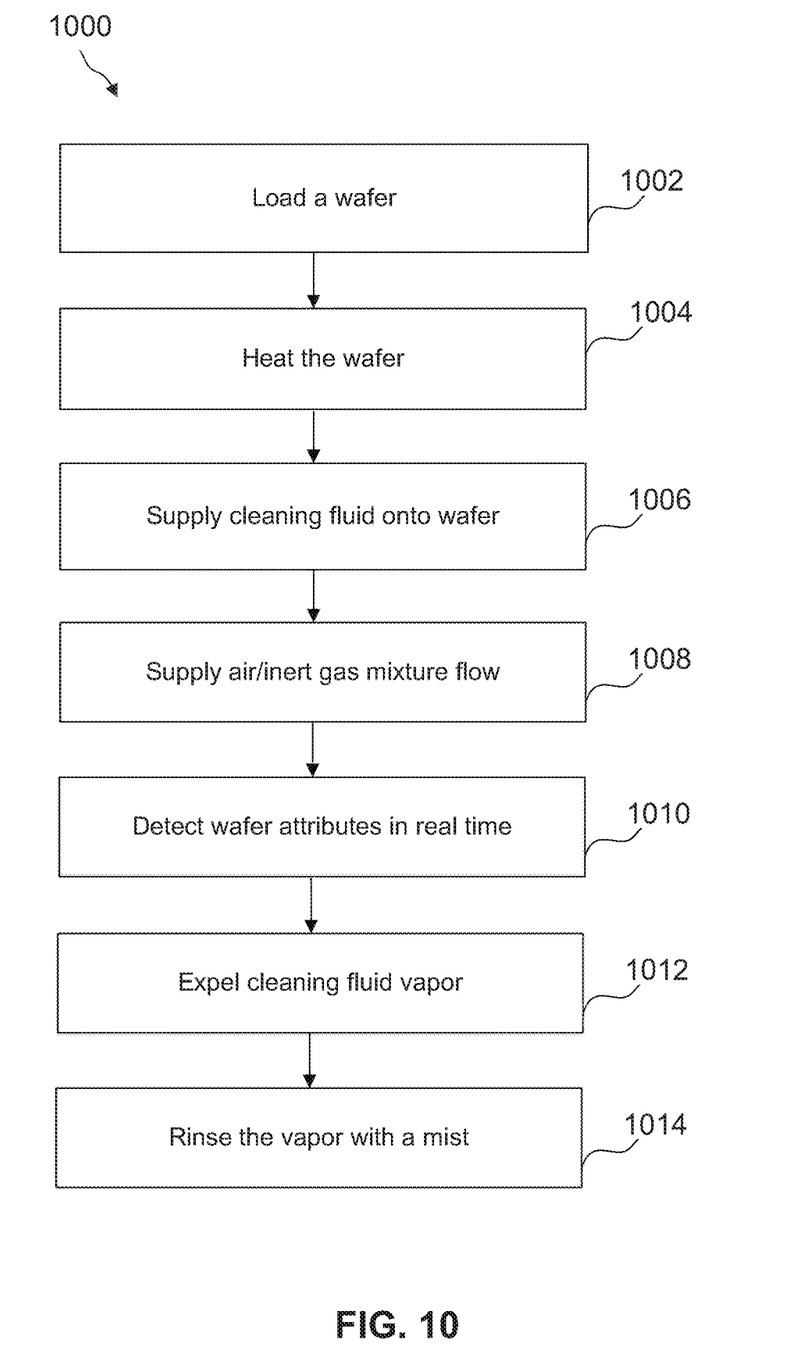
FIG. 10 is a flow chart of an exemplary wafer cleaning method, in accordance with some embodiments.

FIG. 10 is a flow chart of an exemplary wafer cleaning method 1000, in accordance with some embodiments. Other operations may be performed between the various operations of method 1000, and are omitted merely for clarity. The wafer cleaning process of a semiconductor device is not limited to the exemplary method 1000.

Method 1000 starts with operation 1002, where a wafer is loaded. For example, as shown in FIG. 1, wafer 108 is loaded onto wafer holder 106 and held by wafer holder 106 inside enclosure 102. In some embodiments as shown in FIG. 8, wafer 108 can be held by wafer holder 106 having six support pins to reduce the possibility of wafer slide.

Method 1000 continues with operation 1004, where the wafer is heated. For example, wafer 108 can be heated by the heating plate of wafer holder 106 during wafer cleaning.

Method 1000 continues with operation 1006, where a cleaning fluid is supplied onto the wafer. For example, as shown in FIG. 1, a cleaning fluid, e.g., IPA, is supplied by cleaning nozzle 110 onto the major surface (where semiconductor devices are formed) of wafer 108. In some embodiments of the present disclosure, at least a part of an outer surface of cleaning nozzle 110 is covered with a conducting material, such as carbon nanotubes. In some embodiments of the present disclosure, as shown in FIGS. 2 and 3, additional grounding units, such as ionizer 202, magnetic grounding clamp 304, and grounding line 306 can be used to further reduce the static electric charging occurred at cleaning nozzle 110 during operation.

Method 1000 continues with operation 1008, where a flow of a mixture of air and an inert gas into the enclosure. For example, as shown in FIG. 6, FFU 602 can supply the air and $N_2$ gas mixture down flow, and the flow rate of $N_2$ gas is one-half of the flow rate of air in the mixture.

Method 1000 continues with operation 1010, where a set of attributes associated with the wafer are detected in real time. For example, as shown in FIGS. 1 and 4, sensors 112, 114, 402, and 404 can be used to detect the temperature, capture images, and generate a thermo profile at the major surface of wafer 108 during wafer cleaning.

Method 1000 continues with operation 1012, where a vapor generated by the cleaning fluid in the enclosure is expelled through an exhaust unit. For example, as shown in FIG. 1, exhaust unit 118 can expel the cleaning fluid vapor, e.g., IPA vapor, from inner space 104 of enclosure 102 through duct 120.

Method 1000 continues with operation 1014, where the vapor passing through the exhaust unit is rinsed with a mist. For example, as shown in FIGS. 1 and 5, rinse nozzle 122 or 504 can generate a mist by mixing a flow of a fluid (e.g., DI water) and a flow of an inert gas (e.g., $N_2$ gas) and rinse the cleaning fluid vapor, e.g., IPA vapor, with the mist.

Various embodiments in accordance with the present disclosure provide an apparatus and a method for wafer cleaning in semiconductor device manufacturing while minimizing or eliminating flash burning and/or explosion. In some embodiments of the present disclosure, noncombustible materials can be used for an enclosure of the wafer cleaning apparatus to reduce the risk of fire. In some embodiments of the present disclosure, static electric charging can be substantially reduced by improving a grounding unit of the wafer cleaning apparatus to avoid the risk of cleaning chemical flash burning. In some embodiments of the present disclosure, various sensors may be implemented in the wafer cleaning apparatus to monitor the wafer surface temperature and process (e.g., in real time). In some embodiments of the present disclosure, the exhaust unit of the wafer cleaning apparatus can reduce the cleaning chemical vapor concentration in the exhaust. In some embodiments of the present disclosure, a six-pin wafer holder design can be used to minimize or eliminate wafer slide issue during wafer cleaning. In some embodiments of the present disclosure, inert gas flow may be used to replace air flow to reduce an oxygen concentration in the wafer cleaning apparatus.

In some embodiments of the present disclosure, an apparatus includes an enclosure including a noncombustible material, a wafer holder, a cleaning nozzle, at least one sensor, and an exhaust unit. The wafer holder is in the enclosure and configured to hold and heat a wafer. The cleaning nozzle is in the enclosure and configured to supply a flow of a cleaning fluid onto the wafer. At least a part of an outer surface of the cleaning nozzle includes a conducting material. The at least one sensor is in the enclosure and configured to detect one or more attributes associated with the wafer. The exhaust unit is coupled to the enclosure and configured to expel a vapor generated by the cleaning fluid. The exhaust unit includes a rinse nozzle configured to rinse the vapor passing through the exhaust unit with a mist.

In some embodiments of the present disclosure, an apparatus includes a wafer holder, a cleaning nozzle, a fan filter unit, at least one sensor, and an exhaust unit. The wafer holder is configured to hold and heat a wafer. The wafer holder includes at least six support pins and three clamp pins for holding the wafer. The cleaning nozzle is configured to supply a flow of a cleaning fluid onto a surface of the wafer. At least a part of an outer surface of the cleaning nozzle includes a conducting material. The fan filter unit is configured to supply a flow of a mixture of air and an inert gas. The at least one sensor is configured to detect one or more attributes associated with the wafer. The exhaust unit is configured to expel a vapor generated by the cleaning fluid. The exhaust unit includes a rinse nozzle configured to rinse the vapor passing through the exhaust unit with a mist.

In some embodiments of the present disclosure, a method of cleaning a wafer includes loading the wafer onto a wafer holder in an enclosure and heating the wafer by the wafer holder. The method also includes supplying a flow of a cleaning fluid onto a surface of the wafer and supplying a flow of a mixture of air and an inert gas into the enclosure. The method further includes detecting one or more attributes associated with the wafer. The method further includes expelling a vapor generated from the cleaning fluid in the enclosure through an exhaust unit and rinsing the vapor passing through the exhaust unit with a mist.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for cleaning a wafer, comprising:
   loading the wafer onto a wafer holder in an enclosure;
   supplying, with a cleaning nozzle, a flow of a cleaning fluid onto a surface of the wafer; cleaning the wafer with the cleaning fluid;
   grounding the cleaning nozzle with a magnetic grounding clamp coupled to the cleaning nozzle and a grounding line connected to the cleaning nozzle;
   vaporizing the cleaning fluid by heating the wafer with the wafer holder;
   supplying a flow of a mixture of air and an inert gas from a fan filter unit into the enclosure;
   detecting at least one thermal condition of the wafer;
   passing a vapor generated by the cleaning fluid in the enclosure through an exhaust unit; and
   rinsing the vapor passing through the exhaust unit with a liquid flow generated by a first rinse nozzle and a gas flow generated by a second rinse nozzle.

2. The method of claim 1, wherein the supplying the inert gas comprises supplying nitrogen gas ($N_2$) at a flow rate that is one-half of a flow rate of the air.

3. The method of claim 1, further comprising generating a mist with the second rinse nozzle by mixing a flow of another fluid and a flow of another inert gas.

4. The method of claim 1, wherein the rinsing the vapor comprises diluting the vapor with the gas flow.

5. The method of claim 1, wherein the rinsing the vapor comprises generating the liquid flow and the gas flow in an exhaust duct of the exhaust unit.

6. The method of claim 1, wherein the rinsing the vapor comprises generating the gas flow in a same direction as the vapor passing through the exhaust unit.

7. The method of claim 1, wherein at least a part of an outer surface of the cleaning nozzle is coated with a conducting material.

8. The method of claim 1, wherein the detecting at least one thermal condition comprises using an infrared sensor to detect the at least one thermal condition of the wafer.

9. The method of claim 1, further comprising detecting a concentration of the vapor after being rinsed with the liquid flow and the gas flow.

10. The method of claim 1, further comprising adsorbing the vapor passing through an exhaust duct of the exhaust unit with an adsorption material coated on at least a part of an inner surface of the exhaust duct.

11. The method of claim 1, further comprising supplying another inert gas to an additional surface of the wafer, wherein the additional surface is opposite to the surface.

12. The method of claim 1, wherein the first and second rinse nozzles are separately located in the exhaust unit.

13. The method of claim 7, wherein vaporizing the cleaning fluid further comprises supplying, with an ionizer, corona discharges to the cleaning nozzle.

14. The method of claim 9, further comprising stopping the cleaning of the wafer based on the concentration of the vapor.

15. A method for cleaning a wafer, comprising:
holding the wafer with a wafer holder;
supplying, with a cleaning nozzle, a flow of a cleaning fluid onto a surface of the wafer;
cleaning the wafer with the cleaning fluid;
grounding the cleaning nozzle with a magnetic grounding clamp coupled to the cleaning nozzle and a grounding line connected to the cleaning nozzle;
heating the wafer with the wafer holder to vaporize the cleaning fluid;
detecting at least one thermal condition of the wafer;
expelling a vapor of the cleaning fluid through an exhaust unit; and
rinsing, with a mist, the vapor expelled through the exhaust unit.

16. The method of claim 15, wherein the holding the wafer with the wafer holder comprises holding the wafer with:
a plurality of jaws distributed around a peripheral edge of the wafer,
a plurality of support pins on top of the plurality of jaws to form a first circle enclosing the peripheral edge of the wafer, and
a plurality of clamp pins on top of a portion of the plurality of jaws enclosing the peripheral edge and to form a second circle adjacent to the peripheral edge of the wafer for holding the wafer, and
wherein a diameter of the first circle is larger than a diameter of the second circle.

17. The method of claim 15, wherein the rinsing the vapor comprises generating the mist in a same direction as the vapor expelled through the exhaust unit.

18. A method for cleaning a wafer, comprising:
loading the wafer onto a wafer holder in an enclosure;
supplying, with a cleaning nozzle, a flow of a cleaning fluid onto a surface of the wafer;
grounding the cleaning nozzle with a magnetic grounding clamp coupled to the cleaning nozzle and a grounding line connected to the cleaning nozzle;
cleaning the wafer with the cleaning fluid;
vaporizing the cleaning fluid by heating the wafer with the wafer holder;
supplying, with a fan filter unit, a flow of a mixture of air and an inert gas into the enclosure;
detecting at least one thermal condition of the wafer by at least one infrared sensor in the enclosure and connected to a fault detection and classification (FDC) system;
expelling a vapor of the cleaning fluid through an exhaust unit;
generating a mist by a rinse nozzle in the exhaust unit; and
rinsing the vapor expelled through the exhaust unit with the mist.

19. The method of claim 18, wherein the cleaning fluid comprises isopropyl alcohol and the vaporizing the cleaning fluid comprises heating the wafer to a temperature from about 190° C. to about 195° C.

20. The method of claim 18, further comprising holding the wafer with:
at least six support pins distributed on top of six jaws to enclose a peripheral edge of the wafer, and
three clamp pins distributed on top of three of the six jaws to enclose the peripheral edge of the wafer,
wherein a diameter of a first circle formed by each of the at least six support pins to enclose the peripheral edge of the wafer is greater than a diameter of a second circle formed by each of the clamp pins to enclose the peripheral edge of the wafer, and
wherein a height of each of the support pins is greater than a height of each of the clamp pins.

* * * * *

UNITED STATES PATENT AND TRADEMARK OFFICE
CERTIFICATE OF CORRECTION

PATENT NO. : 11,764,081 B2
APPLICATION NO. : 17/350036
DATED : September 19, 2023
INVENTOR(S) : Huang et al.

Page 1 of 1

It is certified that error appears in the above-identified patent and that said Letters Patent is hereby corrected as shown below:

In the Specification

Column 2, Line 43, delete "+10%," and insert -- ±10%, --, therefor.

In the Claims

Column 11, Claim 16, Line 20, delete "wafer," and insert -- wafer; --, therefor.

Column 11, Claim 16, Line 23, delete "wafer, and" and insert -- wafer; --, therefor.

Column 11, Claim 16, Line 27, delete "wafer," and insert -- wafer; --, therefor.

Column 12, Claim 20, Line 25, delete "wafer," and insert -- wafer; --, therefor.

Column 12, Claim 20, Line 27, delete "wafer," and insert -- wafer; --, therefor.

Column 12, Claim 20, Line 32, before "clamp" insert -- three --.

Column 12, Claim 20, Line 33, delete "wafer," and insert -- wafer; --, therefor.

Column 12, Claim 20, Line 34, before "support" insert -- at least six --.

Column 12, Claim 20, Line 35, before "clamp" insert -- three --.

Signed and Sealed this
Twenty-first Day of November, 2023

Katherine Kelly Vidal
*Director of the United States Patent and Trademark Office*